(12) United States Patent
Aime et al.

(10) Patent No.: US 7,947,583 B2
(45) Date of Patent: May 24, 2011

(54) FORMING OF SILICIDE AREAS IN A SEMICONDUCTOR DEVICE

(75) Inventors: Delphine Aime, Grenoble (FR); Benoît Froment, Brussels (BE)

(73) Assignee: STMicroelectronics, SA, Montrouge (FR)

(*) Notice: Subject to any disclaimer, the term of this patent is extended or adjusted under 35 U.S.C. 154(b) by 591 days.

(21) Appl. No.: 11/592,398

(22) Filed: Nov. 2, 2006

(65) Prior Publication Data
US 2007/0099408 A1 May 3, 2007

(30) Foreign Application Priority Data

Nov. 2, 2005 (FR) ...................... 05 53317

(51) Int. Cl.
*H01L 21/425* (2006.01)
(52) U.S. Cl. ................ 438/533; 438/592; 257/E21.439
(58) Field of Classification Search ................. 438/533, 438/592; 257/E21.439, E21.44
See application file for complete search history.

(56) References Cited

U.S. PATENT DOCUMENTS

| 6,242,776 B1 * | 6/2001 | Hause et al. ................ 257/344 |
| 6,869,867 B2 * | 3/2005 | Miyashita et al. ............ 438/586 |
| 6,893,930 B1 | 5/2005 | Yu et al. |

FOREIGN PATENT DOCUMENTS

BE 1 015 722 A4 7/2005

OTHER PUBLICATIONS

Sim J H et al., "Dual Work Function Metal Gates Using Full Nickel Silicidation of Doped Poly-Si", IEEE Electron Device Letters, IEEE Service Center, New York, NY, US, vol. 24, No. 10, Oct. 2003; pp. 631-633.
Search Report for French application No. FR 0553317 dated Jun. 13, 2006.

* cited by examiner

*Primary Examiner* — Chandra Chaudhari
(74) *Attorney, Agent, or Firm* — Lisa K. Jorgenson; Kevin D. Jablonski; Graybeal Jackson LLP

(57) ABSTRACT

An embodiment of a method for forming silicide areas of different thicknesses in a device comprising first and second silicon areas, comprising the steps of: implanting antimony or aluminum in the upper portion of the first silicon areas; covering the silicon areas with a metallic material; and heating the device to transform all or part of the silicon areas into silicide areas, whereby the silicide areas formed at the level of the first silicon areas are thinner than the silicide areas formed at the level of the second silicon areas.

22 Claims, 2 Drawing Sheets

FORMING OF SILICIDE AREAS IN A SEMICONDUCTOR DEVICE

PRIORITY CLAIM

The present application claims the benefit of French Patent Application No. 05/53317, filed Nov. 2, 2005, which application is incorporated herein by reference in its entirety.

TECHNICAL FIELD

An embodiment of the invention relates to a method for manufacturing silicide areas of different thicknesses in a device such as an integrated circuit.

DISCUSSION OF THE RELATED ART

FIGS. 1A to 1E illustrate a known method for forming a CMOS transistor of a "totally silicided" type (TOSI). The gate of such a transistor is totally silicided and the silicide thickness is approximately 100 nm. The source and drain areas of this transistor are covered with a thin silicon layer of an approximately 10-nm thickness.

In an initial step, illustrated in FIG. 1A, a conventional transistor structure is formed on a silicon substrate 1. The transistor comprises a polysilicon gate 2 insulated from substrate 1 by a thin insulating layer 3. Spacers 4 and 5 are placed against the sides of the stacking of thin insulating layer 3 and of gate 2. Source/drain areas 6 and 7 are formed in the upper portion of substrate 1 on either side of gate 2.

In a next step, illustrated in FIG. 1B, the previously-obtained structure is covered with a metal layer, for example, a nickel layer 10. The entire structure is heated up to have nickel layer 10 react with the silicon areas in contact therewith. Silicide areas 11 and 12 at the surface of source/drain areas 6 and 7, as well as a silicide area 13 at the surface of gate 2, are obtained after anneal. Nickel layer 10 is then removed.

At the next step, illustrated in FIG. 1C the previously-obtained structure is covered with an insulating layer 20. A chem.-mech. polishing of insulating layer 20 is then performed to expose silicon area 13 at the surface of gate 2.

At the next step, illustrated in FIG. 1D, a nickel layer 30 is deposited again on the previously-obtained structure. The entire structure is then heated up to have nickel layer 30 react with the silicon of gate 2.

FIG. 1E illustrates the transistor structure after anneal and removal of nickel layer 30. Silicon gate 2 is then replaced with a silicide gate 40.

A potential disadvantage of the previously-described method is that it may require a large number of steps. Further, the method may require a chem.-mech. polishing step, which may be difficult to implement industrially.

SUMMARY

An embodiment of the present invention is a method comprising a small number of steps to form silicide areas of different thicknesses.

Another embodiment is a method which is easy to implement.

Yet another embodiment is a method for forming silicide areas of different thicknesses in a device comprising first and second silicon areas, comprising the steps of: implanting antimony or aluminum in the upper portion of the first silicon areas; covering the silicon areas with a metallic material; and heating the device to transform all or part of the silicon areas into silicide areas, whereby the silicide areas formed at the level of the first silicon areas are thinner than the silicide areas formed at the level of the second silicon areas.

In an embodiment of the above-mentioned method, after implantation, the antimony or aluminum concentration in the first silicon areas is smaller than or equal to $5*10^{15}$ atoms/cm$^3$.

In an embodiment of the above-mentioned method, after implantation, the antimony concentration in the first silicon areas is smaller than or equal to $10^{15}$ atoms/cm$^3$.

According to a variation of the above-mentioned method, the method further comprises a step of removal of the metallic material.

Another embodiment is a method for forming a CMOS transistor comprising the steps of: forming, in and above a silicon substrate of a first doping type, a transistor structure comprising a silicon gate insulated from the substrate by a thin insulating layer, and source/drain areas of a second doping type placed in the upper portion of the substrate on either side of the gate; and transforming the silicon gate into a silicide gate and forming silicide areas at the surface of the source/drain areas according to the above-mentioned method, the source/drain areas and the silicon gate respectively forming first silicon areas and a second silicon area.

In an embodiment of the above-mentioned method, the heating step is performed at high temperature and the method further comprises an anneal at very high temperature.

In an embodiment of the above-mentioned method, intended to form an NMOS-type transistor, antimony is implanted in the source/drain areas comprising N-type dopant elements.

In an embodiment of the above-mentioned method, intended to form a PMOS-type transistor, aluminum is implanted in the upper portion of the source/drain areas comprising P-type dopant elements.

In an embodiment of the above-mentioned method, the silicon gate comprises dopant elements of the second doping type.

Still another embodiment provides a CMOS transistor structure formed in and above a doped silicon substrate of a first doping type, comprising a silicon gate insulated form the substrate by a thin insulating layer and source/drain areas of a second doping type placed in the upper portion of the substrate on either side of the gate, and such that the source/drain areas contain antimony or aluminum by a concentration smaller than $5.10^{15}$ atoms/cm$^3$.

BRIEF DESCRIPTION OF THE DRAWINGS

Features and advantages of the present invention will be discussed in detail in the following non-limiting description of specific embodiments in connection with the accompanying drawings.

DETAILED DESCRIPTION

Figure 1A:
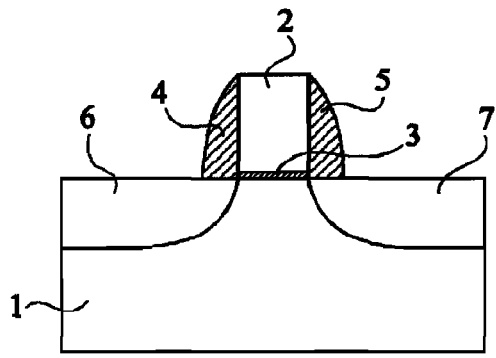
FIGS. 1A to 1E are cross-section views of structures obtained at the end of successive steps of a known method for forming a "TOSI" transistor.
Figure 1B:
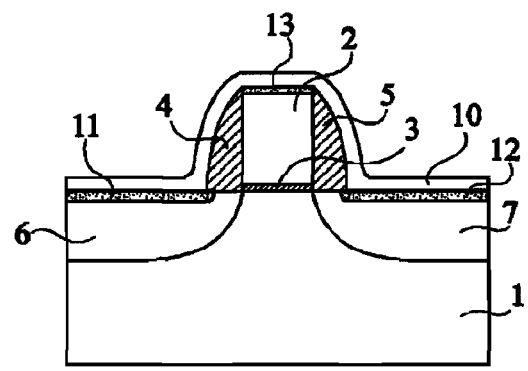
Figure 1C:
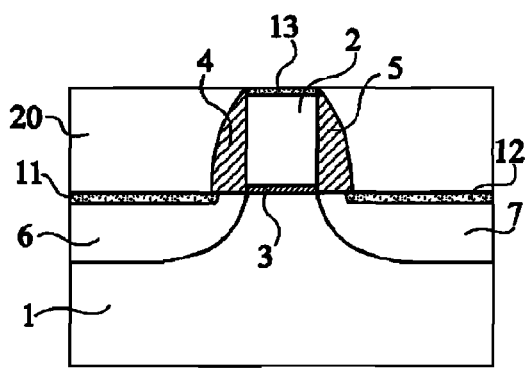
Figure 1D:
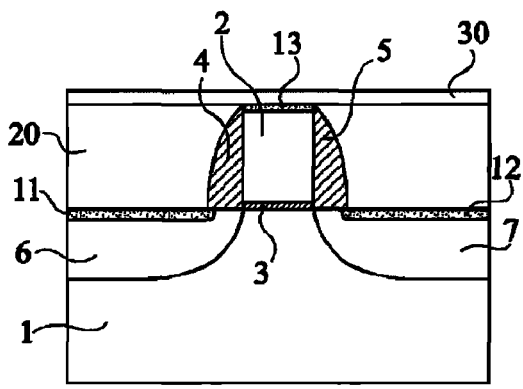
Figure 1E:
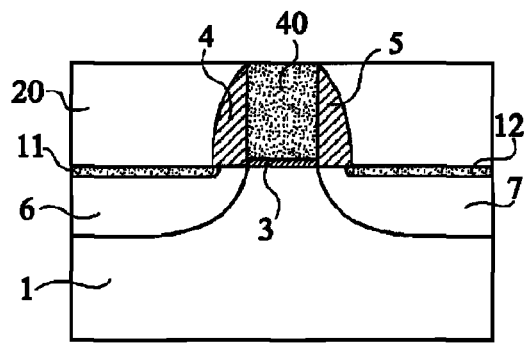

For clarity, the same elements have been designated with the same reference numerals in the different drawings and further, as usual in the representation of semiconductor devices, the various drawings are not to scale.

An embodiment of the invention comprises a single siliciding step, or more specifically, a single deposition of a metal layer on silicon areas to form silicide in a subsequent anneal. Prior to this siliciding step, antimony or aluminum is implanted in the upper portion of the silicon areas at the surface of which a thin silicide layer is desired to be formed. No antimony or aluminum implantation is performed in the silicon areas in which a thick silicide layer is desired to be formed.

The presence of antimony or aluminum in relatively small quantity enables "slowing down" the forming of silicide and accordingly limiting the thickness of the silicide areas formed at the surface of silicon areas comprising antimony or aluminum.

An example of implementation is described hereafter in relation with FIGS. 2A to 2G in the case of the forming of an NMOS-type TOSI transistor.

Figure 2A:
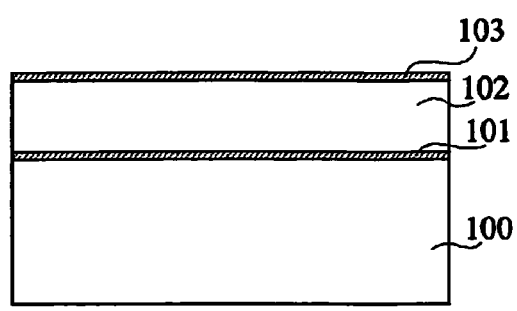
FIGS. 2A to 2G are cross-section views of structures obtained at the end of successive steps of an example of embodiment of the method of the present invention applied to the forming of a TOSI transistor.

In an initial step, illustrated in FIG. 2A, a thin insulating layer 101, a polysilicon layer 102, and a protection layer 103 are successively formed above a silicon substrate 100. The protection layer is for example formed of silicon oxide or titanium nitride. Thin insulating layer 101 is for example formed of silicon oxide or of any other dielectric material exhibiting a high permittivity value.

Figure 2B:
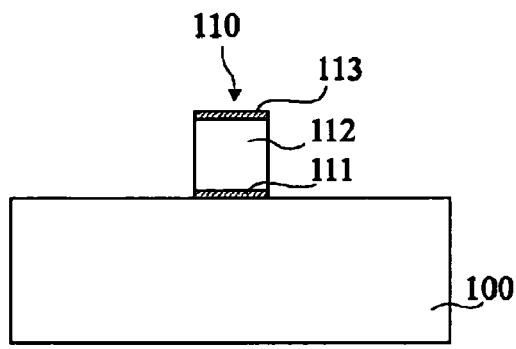

At the next step, illustrated in FIG. 2B, the stacking of layers 101 to 103 is etched to keep a gate stack 110 comprising a thin insulating portion 111, a silicon gate portion 112, and a protection portion 113.

Figure 2C:
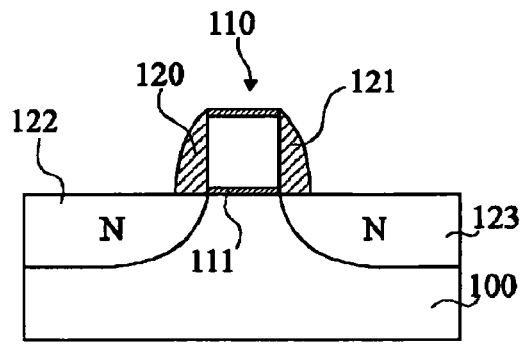

At the next step, illustrated in FIG. 2C, spacers 120 and 121 are formed against the sides of gate stack 110. Source/drain areas 122 and 123 are then formed, in the upper portion of substrate 100 on either side of gate stack 110. Source/drain areas 122 and 123 are, in this example, N-type doped.

Figure 2D:
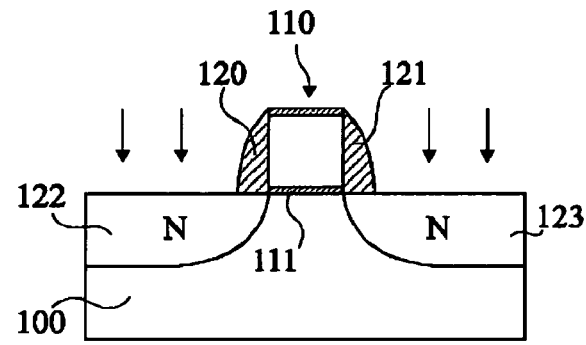

At the next step, illustrated in FIG. 2D, an antimony implantation is performed in the upper portion of source/drain areas 122 and 123. It should be noted that gate portion 112 is protected by protection portion 113 in this antimony implantation.

Figure 2E:
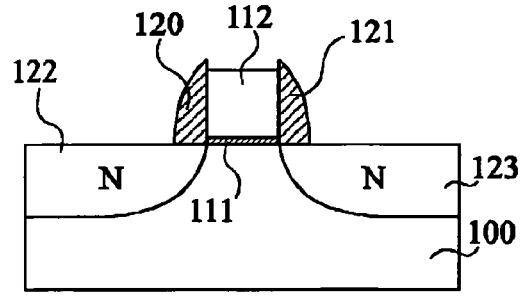

At the next step, illustrated in FIG. 2E, protection portion 113 is removed to expose gate portion 112.

Figure 2F:
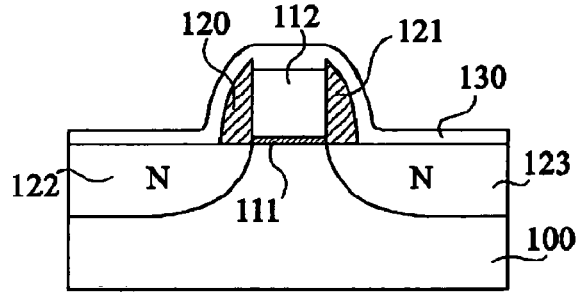

At the next step, illustrated in FIG. 2F, the previously-obtained structure is covered with a metal layer 130, for example, formed of nickel. An anneal is then performed to have metal layer 130 react with the silicon areas in contact therewith, that is, source/drain areas 122 and 123 and gate portion 112.

Figure 2G:
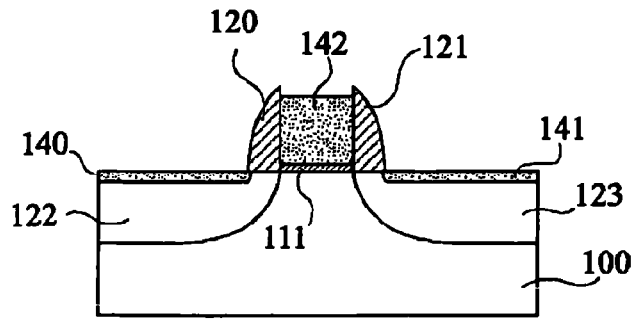

FIG. 2G illustrates the structure of the transistor obtained after anneal and removal of metal layer 130. Thin. silicide areas 140 and 141 are formed at the surface of source/drain areas 122 and 123. Gate portion 112 has become a totally silicided gate portion 142.

As a non-limiting indication, the features of the transistor shown in FIG. 2G are the following:

gate "length" or distance between source and drain areas 122/123: 120 nm;
thickness of insulating portion 111: 2 nm;
thickness of gate portion 142: 100 nm;
thickness of silicide areas 140 and 141: 12 nm.

It should be noted that in this embodiment, the ratio between the thickness of gate portion 142 and the thickness of each of silicide areas 140 and 141 is close to 10. This ratio may be greater or smaller by adjusting the antimony concentration implanted in the source/drain areas prior to the siliciding step. The higher the antimony concentration, the thinner silicidation areas 140 and 141. For example, a thickness ratio of 10 may be obtained with an antimony concentration of approximately $3.10^{15}$ atoms/cm$^3$. When a thickness ratio smaller than 5 is desired to be obtained, antimony concentrations smaller than $10^{15}$ atoms/cm$^3$ may be used.

According to a variation of the previously-described method, instead of antimony, aluminum is implanted in source/drain areas 122 and 123 prior to the siliciding step. The aluminum present in source/drain areas 122 and 123 enables limiting the forming of silicide at their surface. However, it should be noted that the "limiting" power of aluminum may be weaker than that of antimony. To have a thickness ratio of 5 between the thin and thick silicide areas, an aluminum concentration of approximately $5.10^{15}$ atoms/cm$^3$ may be used. An advantage, however, of aluminum over antimony, is that aluminum is a P-type dopant element conversely to antimony, which is an N-type dopant. Thus, in the case where N-type dopant elements are not desired to be introduced into the silicon area at the surface of which a thin silicide layer is formed, one may use.

It should however be noted that, given the small quantites of antimony that "slow down" the forming of silicide, its use should not be disturbing in the case of a PMOS transistor. Indeed, the P-type dopant element concentrations in the source/drain areas conventionally are $10^{16}$ atoms/cm$^3$ and an antimony concentration smaller than or equal to $10^{15}$ atoms/cm$^3$ typically has but little effect on the doping.

According to an implementation mode of the siliciding step previously described in relation with FIGS. 2F and 2G, the siliciding is performed in two phases. The first phase comprises the reacting of source/drain areas 122, 123 and gate portion 112 with metal layer 130 in a "high-temperature" enclosure, for example, equal to 250° C., for a time enabling transforming an upper portion of gate 112 into an Ni$_2$Si-type silicide. The transistor structure is then removed from the heating enclosure and the metal layer 130 is removed. Then, in a second phase, the transistor structure is placed back in a heating enclosure at a higher temperature, for example, equal to 400° C., to carry on the siliciding method. A portion of the Ni$_2$Si silicide present in the upper portion of gate 112 then reacts with the lower portion of the silicon gate portion to form an NiSi-type silicon. A totally silicided gate portion 112 is finally obtained. The lower portion of the gate portion is formed of an NiSi-type silicide and the upper portion is formed of an Ni$_2$Si-type silicide. Further, "thin" silicide areas 140 and 141 formed at the surface of source/drain areas 122 and 123 are entirely formed of Ni$_2$Si-type silicide.

An advantage of this siliciding method in two phases is that it may avoid the spacers 120 and 121 reacting with metal layer 130 to form on the spaces a thin conductive silicide layer that may short-circuit the gate and the source/drain areas of the transistor.

Another advantage of this siliciding method in two phases is that may enable obtaining an NiSi-type silicide, which is typically less resistive than an Ni$_2$ Si-type silicide.

Further, silicon layer 102 intended to form gate portion 112 may be P- or N-type doped before being covered with protection layer 103. The doping of gate portion 112 enables adjusting the transistor threshold voltage. The implantation of P-type dopant elements on forming of a PMOS transistor or the implantation of N-type dopants on forming of an NMOS transistor enables having a greater capacitive coupling between the gate portion and the substrate.

Of course, the present invention has embodiments other than those described here in detail.

For example, in the case where silicide areas exhibiting more than two different thicknesses are desired to be formed, different antimony concentrations may be implanted prior to the siliciding step. Different elements, e.g., antimony or aluminum, may further be implanted, to obtain silicide areas of different thicknesses.

Further, metallic materials other than nickel may be used to form the silicide areas. Cobalt, titanium, tungsten, ytterbium, or an alloy based on one or several of these metals such as nickel/cobalt or nickel/ytterbium, may, for example, be used.

Such other embodiments are intended to be part of this disclosure, and are intended to be within the spirit and the scope of the present invention. Accordingly, the foregoing description is by way of example only and is not intended to be limiting.

The invention claimed is:

1. A method for forming silicide areas of different thicknesses in a device comprising first and second silicon areas, comprising the steps of:
   implanting antimony or aluminum in the upper portion of the first silicon areas, wherein after implantation the antimony or aluminum concentration in the first silicon areas is smaller than or equal to $5*10^{15}$ atoms/cm$^3$;
   covering the silicon areas with a metallic material; and
   heating the device to transform all or part of the silicon areas into silicide areas, wherein the silicide areas formed at the level of the first silicon areas are thinner than the silicide areas formed at the level of the second silicon areas.

2. The method of claim 1, further comprising a step of removing the metallic material.

3. A method for forming a CMOS transistor comprising the steps of:
   forming, in and above a silicon substrate of a first doping type, a transistor structure comprising a silicon gate insulated from the substrate by a thin insulating layer, and source/drain areas of a second doping type placed in the upper portion of the substrate on either side of the gate; and
   transforming the silicon gate into a silicide gate and forming silicide areas at the surface of the source/drain areas according to the method of claim 1, the source/drain areas and the silicon gate respectively forming first silicon areas and a second silicon area.

4. The method of claim 2, wherein the heating step is performed at high temperature and further comprising an anneal at very high temperature.

5. The method of claim 3, intended to form an NMOS-type transistor, wherein antimony is implanted in the source/drain areas comprising N-type dopant elements.

6. The method of claim 3, intended to form a PMOS-type transistor, wherein aluminum is implanted in the upper portion of the source/drain areas comprising P-type dopant elements.

7. The method of claim 3, wherein the silicon gate comprises dopant elements of the second doping type.

8. A method, comprising:
   introducing an antimony or aluminum dopant into a first semiconductor region, the antimony or aluminum having a concentration that is small enough to inhibit silicidation of the first semiconductor region;
   forming a metal over the first semiconductor region and over a second semiconductor region; and
   heating the first and second semiconductor regions and the metal to form over the first semiconductor region a silicide layer having a first thickness and to form over the second semiconductor region a totally silicided portion having a second thickness that is greater than the first thickness.

9. The method of claim 8 wherein the first and second semiconductor regions comprise silicon.

10. The method of claim 8 wherein:
    the first semiconductor region is disposed in a first semiconductor layer; and
    the second semiconductor region is disposed in a second semiconductor layer.

11. The method of claim 8 wherein:
    the first semiconductor region comprises a transistor source/drain; and
    the second semiconductor region comprises a transistor gate.

12. The method of claim 8 wherein introducing the dopant comprises implanting the dopant into the first semiconductor region.

13. The method of claim 8, further comprising prohibiting introduction of the dopant into the second semiconductor region while introducing the dopant into the first semiconductor region.

14. The method of claim 8 wherein heating the first and second semiconductor regions and the metal comprises:
    heating the first and second semiconductor regions and the metal for a first period of time;
    removing the metal; and
    heating the first and second semiconductor regions for a second period of time.

15. The method of claim 8 wherein heating the first and second semiconductor regions and the metal comprises:
    heating the first and second semiconductor regions and the metal for a period of time;
    removing the metal; and
    heating the first and second semiconductor regions for a second period of time.

16. The method of claim 8 wherein heating the first and second semiconductor regions and the metal comprises:
    heating the first and second semiconductor regions and the metal at a first temperature;
    removing the metal; and
    heating the first and second semiconductor regions at a second temperature.

17. The method of claim 8 wherein heating the first and second semiconductor regions and the metal comprises:
    heating the first and second semiconductor regions and the metal at a first temperature;
    removing the metal; and
    heating the first and second semiconductor regions at a second temperature that is higher than the first temperature.

18. A method, comprising:
    introducing an antimony dopant into a drain/source semiconductor region, wherein after introduction, the antimony concentration in the drain/source semiconductor region is smaller than or equal to $5*10^{15}$ atoms/cm$^3$;
    forming a metal over the drain/source semiconductor region and over an undoped gate semiconductor region; and
    heating the drain/source and gate semiconductor regions and the metal to form over the drain/source semiconductor region a first silicide layer having a first thickness and to form over the gate semiconductor region a second silicide layer having a second thickness that is greater than the first thickness.

19. The method of claim 18, wherein the antimony concentration in the drain/source semiconductor region is smaller than or equal to $10^{15}$ atoms/cm$^3$.

20. The method of claim 18, wherein the semiconductor regions form an NMOS-type transistor.

21. A method for forming a totally silicided MOS transistor, comprising the steps of:
   implanting antimony or aluminum in the upper portion of source and drain regions of the MOS transistor, the implanting having a concentration smaller than or equal to $5*10^{15}$ atoms/cm$^3$;
   forming a gate stack including a silicon gate region having no dopant implanted in the silicon gate region;
   covering the source and drain regions and the silicon gate region with a metallic material; and
   heating the device to transform all or part of the source, drain, and gate regions into silicide regions, the silicide regions formed in the source and drain regions being thinner than the silicide region formed in the silicon gate region.

22. The method of claim 21, further comprising a step of removing the metallic material.

* * * * *